United States Patent [19]
Sussman

[11] Patent Number: 4,998,222
[45] Date of Patent: Mar. 5, 1991

[54] DYNAMIC RANDOM ACCESS MEMORY WITH INTERNALLY GATED RAS

[75] Inventor: Howard H. Sussman, Acton, Mass.

[73] Assignee: NEC Electronics Inc., Mountain View, Calif.

[21] Appl. No.: 445,067

[22] Filed: Dec. 4, 1989

[51] Int. Cl.⁵ .............................................. G11C 13/00
[52] U.S. Cl. ..................................... 365/203; 365/193; 365/233
[58] Field of Search ..................... 365/203, 233, 193

[56] References Cited

U.S. PATENT DOCUMENTS

| | | | |
|---|---|---|---|
| 4,322,825 | 3/1982 | Nagami | 365/203 |
| 4,581,722 | 4/1986 | Takemae | 365/230 |
| 4,734,880 | 3/1988 | Collins | 364/900 |
| 4,802,129 | 1/1989 | Hoekstra et al. | 365/203 |

Primary Examiner—Terrell W. Fears
Attorney, Agent, or Firm—Skjerven, Morrill MacPherson, Franklin & Friel

[57] ABSTRACT

A dynamic random access memory having a bit line precharge capability is provided with an internally gated $\overline{RAS}$ signal, such that bit line precharge operation does not being until an internal timing signal is issued indicating completion of the read/write internal timing chains. The external $\overline{RAS}$ signal is made to transition prematurely into an inactive (or precharge) state, so that the bit line precharge operation necessarily occurs immediately after the internal timing chains are completed. This occurs independent of any circuit fabrication variations or component tolerances.

9 Claims, 13 Drawing Sheets

DYNAMIC RANDOM ACCESS MEMORY WITH INTERNALLY GATED RAS

BACKGROUND OF THE INVENTION

This invention relates to the design of dynamic random access memory (DRAM) components, and in particular, relates to the internal timing scheme of DRAMs.

DESCRIPTION OF THE PRIOR ART

To minimize pin count in a DRAM package, a 2-clock multi-address system has been employed in DRAM designs. Basically, two input clock signals defined as the ROW ADDRESS STROBE ($\overline{RAS}$) and the COLUMN ADDRESS STROBE ($\overline{CAS}$), are supplied to the DRAM component in a predetermined sequence to signal respectively that the row and column address inputs are ready at the address terminal of the memory component.

By convention, when the $\overline{RAS}$ and $\overline{CAS}$ signals transition to low logic state, the DRAM component responds by enabling internal row and column address decoding circuitries.

The row and column addresses together select a memory cell in a memory system organized as an array. Typically, as shown in FIG. 1, the row address selects one of the word lines 10 (i.e., a row of memory cells sharing the same row address), and the column address selects one of the bit lines 11 (i.e., a column of memory cells sharing the column address). The selected memory cell 12 will have both selected row and column addresses.

Another control signal, WRITE ENABLE ($\overline{WE}$) determines whether the operation requested on the memory cell is a read operation, a write operation or a read-modify-write operation according to the timing of $\overline{WE}$'s transition with respect to the $\overline{RAS}$ and $\overline{CAS}$ signals. Like $\overline{RAS}$ and $\overline{CAS}$, $\overline{WE}$ is active at logic state low. When $\overline{WE}$ is low, the datum at the data terminals of the memory component is written into the memory cell selected by the row and column addresses; otherwise, i.e., $\overline{WE}$ stays logic-high during the memory cycle, the stored datum of the memory cell is output to the data terminal of the memory component.

Arrival of the $\overline{RAS}$ signal (going low) triggers a sequence of internal signals or events within the memory component. Another set of timing signals are triggered by the $\overline{CAS}$. The proper timing of these signals as well as their sequence is essential to the proper operation of the memory. The sequence of signals or events triggered by the $\overline{RAS}$ signal is called the $\overline{RAS}$ timing chain, and the sequence of signals or events triggered by the arrival of the $\overline{CAS}$ signal is called the $\overline{CAS}$ timing chain.

In some embodiments, it is essential that the $\overline{CAS}$ timing chain not precede certain events in the $\overline{RAS}$ timing chain. As a result, a gating of the $\overline{CAS}$ timing chain by an $\overline{RAS}$ timing chain event has been employed. An example of a gated $\overline{CAS}$ implementation is disclosed in U.S. Pat. No. 4,322,825 to A. Nagami.

FIG. 2 shows a typical organization of a dynamic random access memory system 20. A discussion of the operation in a DRAM system of FIG. 2 is found in Nagami's U.S. Pat. No. 4,322,825, incorporated herein by reference. As shown, the external signals $\overline{RAS}$, $\overline{CAS}$ trigger the control circuitry 21 to provide a number of internal timing signals: AERAS, AECAS, RA, SE and DE.

The circuit of U.S. Pat. No. 4,322,825 which generates the AERAS, AECAS, RA, SE and DE and other internal timing signals is shown in FIG. 3. FIG. 3 shows two schematic circuits; the $\overline{RAS}$ timing chain circuit 31 is shown in the upper portion of FIG. 3, and the $\overline{CAS}$ timing chain circuit 32 is shown in the lower portion of FIG. 3. The logic gates B1-B9 are delay elements, and logic gates I1-I4 are inverting delay elements. As shown, an output $XP_{00}$ of the $\overline{RAS}$ timing chain is used to gate the $\overline{CAS}$ input, so that the $\overline{CAS}$ timing chain may not be triggered off before row address decode is complete. The $\overline{RAS}$ timing chain's first signal is complementary timing signal RAS, which is a logic complement of the external signal $\overline{RAS}$ in FIG. 3. However, even though the $\overline{CAS}$ timing chain's first signal is complementary timing signal CAS, CAS only a logic complement of the external signal $\overline{CAS}$ as long as $XP_{00}$ is at logic high. Timing signal DE triggers the writing of an external datum at data-in terminal 63 (FIG. 2) into the memory array, or the output of the stored datum at the selected memory location to the data-out terminals (junction of transistors Q61 and Q62, FIG. 2); the choice between these two operations is selected by whether a $\overline{WE}$ active pulse is received. The control circuit that provides internal control signals to perform the selection is immaterial to the present invention, and well-known to those skilled in the art.

After the datum is read from or written into the memory cell, the circuit elements of the memory component must be reset to predetermined states before the next memory access operation may begin. Because a high premium is placed on fast memory cycle time, it is highly desirable to have not only a short read or write access time but also a short reset time. Because a significant amount of the delay in circuit operation is due to the charging time necessary to bring the bit lines to logic high voltages, memory circuits are designed to have the bit lines pre-charged during the reset period to ensure fast read and write times. FIG. 1 shows a precharge transistor 13. When $\overline{RAS}$ is high, the complementary signal $\overline{RAS}$ (complementary to $\overline{RAS}$) is used to pull the bit lines 11 up to supply voltage through depletion mode precharge transistor 13. The earlier the bit line is precharged, the sooner the next read or write cycle may begin. Therefore, it is highly desirable for the bit lines to be precharged as soon as possible. Precharging of the bit line is known in the art as $\overline{RAS}$ precharge.

In the prior art, in order to obtain a valid output datum during a read operation, or to cause a correct datum to be written into a selected memory location in a write operation, the signal to initiate precharge of the bit line must be generated after a time estimated to provide for completion of both $\overline{RAS}$ and $\overline{CAS}$ timing chains. In practice, precharge may only begin after a time set by estimating the worst case delay in the timing chain, including providing for the margin of variation from chip to chip and variations in the operating environment. In many situations, the worst case delay is an over-conservative estimate, leading to the waste of very valuable time.

FIG. 4 shows the prior art practice. In the prior art, because of variations in the manufacturing process, and also in the operating environment, the system designer using the DRAM may not bring $\overline{RAS}$ inactive, and hence initiate precharge, until a worst-case deviation, labelled "skew" in FIG. 4 is added to tRAS, to provide for the variations discussed above.

The DRAM system will perform at a higher clock rate (i.e., shorter system cycle time) if the precharge operation is begun as soon as possible, while maintaining reliable operation In addition, it is also desirable that any improvement over the existing timing scheme does not require additional timing signals or signaling protocol changes external to the memory component.

SUMMARY OF THE INVENTION

It is an object of the present invention to provide a $\overline{RAS}$ precharge signal which occurs at the earliest possible moment after a memory read or write operation.

It is a further object of the present invention to provide an optimal $\overline{RAS}$ precharge cycle to shorten the total system cycle time without requiring additional timing signals or signaling protocols charges.

According to the present invention, an internally gated $\overline{RAS}$ precharge signal is provided so that $\overline{RAS}$ precharge begins upon receipt of this internally generated signal, and not upon the elapse of a predetermined time period. This internally generated $\overline{RAS}$ precharge signal is provided at the completion of the last operation in the $\overline{RAS}$ and $\overline{CAS}$ timing chains which is affected by a premature initiation of a $\overline{RAS}$ precharge signal.

The above-mentioned and other features and objects of the present invention will become more apparent by reference to the following description of the preferred embodiments of the invention taken in conjunction with the various figures.

DETAILED DESCRIPTION OF THE PREFERRED EMBODIMENT

Figure 5:
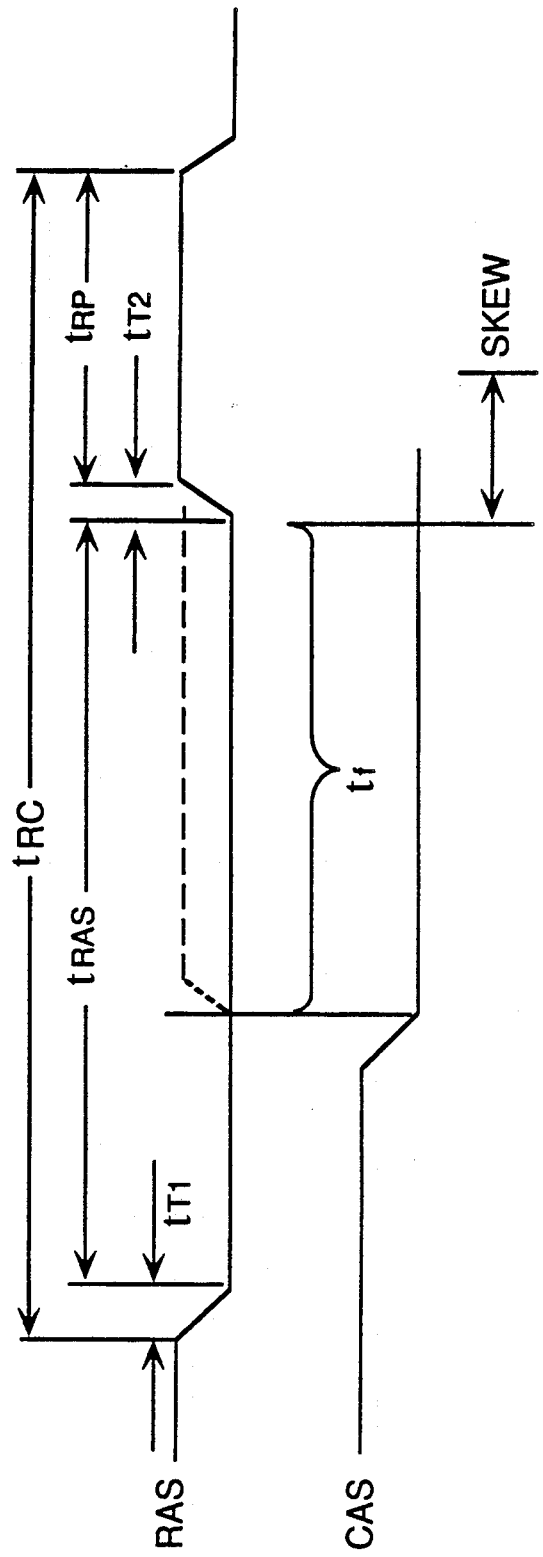
FIG. 5 shows the $\overline{RAS}$ precharge timing scheme in the present invention.

The timing scheme of the present invention is shown in FIG. 5. The present invention is applicable to DRAM system such as described above and illustrated in FIG. 2

The present invention allows the user of the DRAM to initiate a new read or write cycle, by asserting the $\overline{RAS}$ active signal, after one random read or write cycle time (tRC), thereby achieving maximum efficiency, as discussed below.

FIG. 5 shows the ideal minimum cycle, which is $$tRC = tT_1 + tRAS + tT_2 + tRP$$

where $tT_1$ is the transition time from logic high to logic low, $tT_2$ is the transition time from logic low to logic high, RAS is the minimum pulse width of $\overline{RAS}$ required to be active during a read or write cycle, and and tRP is the system precharge time necessary to bring the system ready for the next memory access cycle.

The times $tT_1$, $tT_2$, tRAS, and tRP are usually defined in the specification supplied to the system designer using the DRAM.

The present invention allows the system designer using the DRAM to bring $\overline{RAS}$ inactive (i.e., to logic high) any time after $\overline{CAS}$ is made active. This period $t_f$ when the system designer may bring $\overline{RAS}$ to logic high is shown in dotted line in FIG. 5. According to the present invention, an internal timing signal initiates precharge when the system is ready, rather than at the moment $\overline{RAS}$ is brought to logic high. The present invention thus obviates the need for the system designer to provide a worst-case skew, and allows precharge to begin at the earliest possible time.

Figure 2:
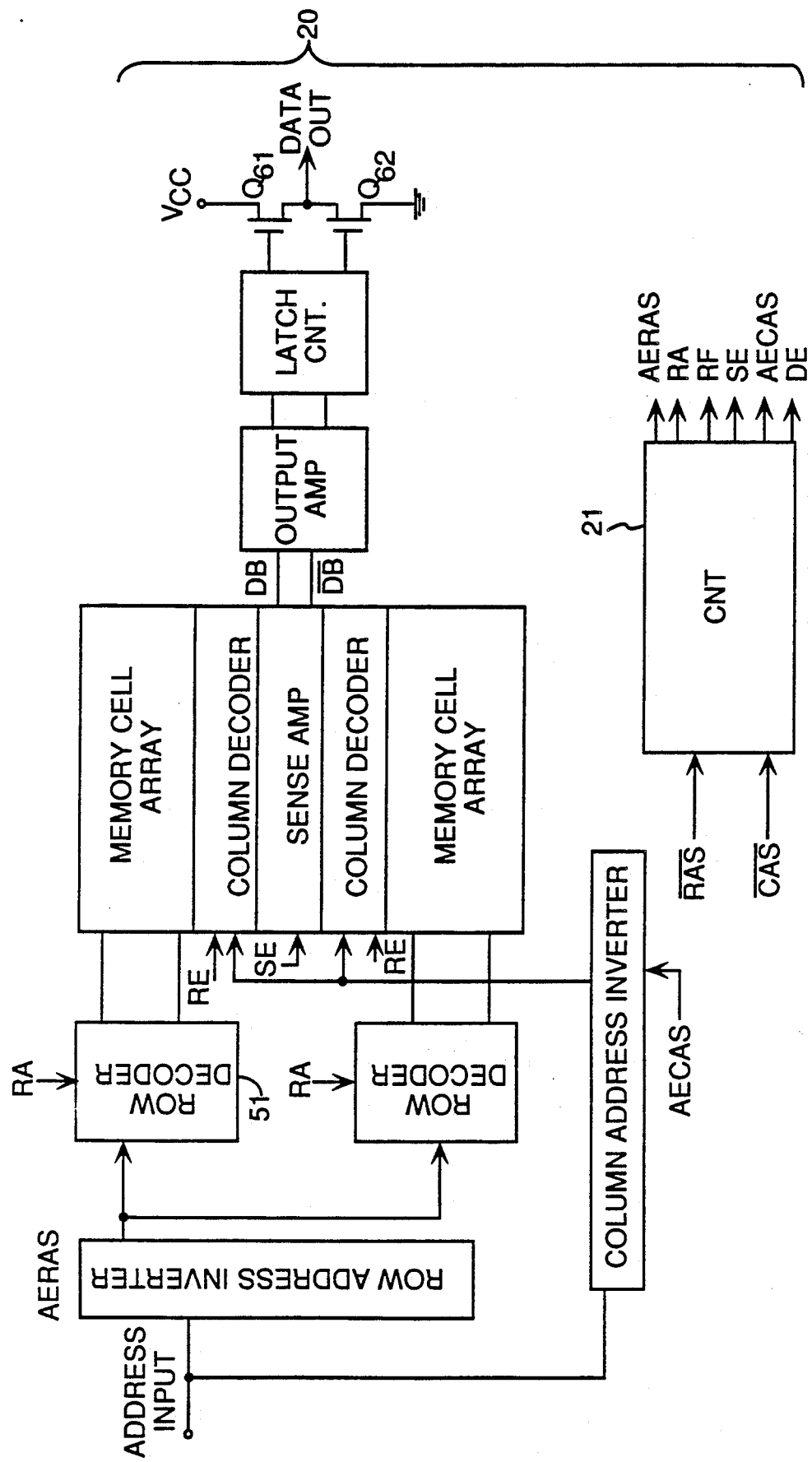
FIG. 2 shows a typical prior art organization of a dynamic random access memory.
Figure 6A:
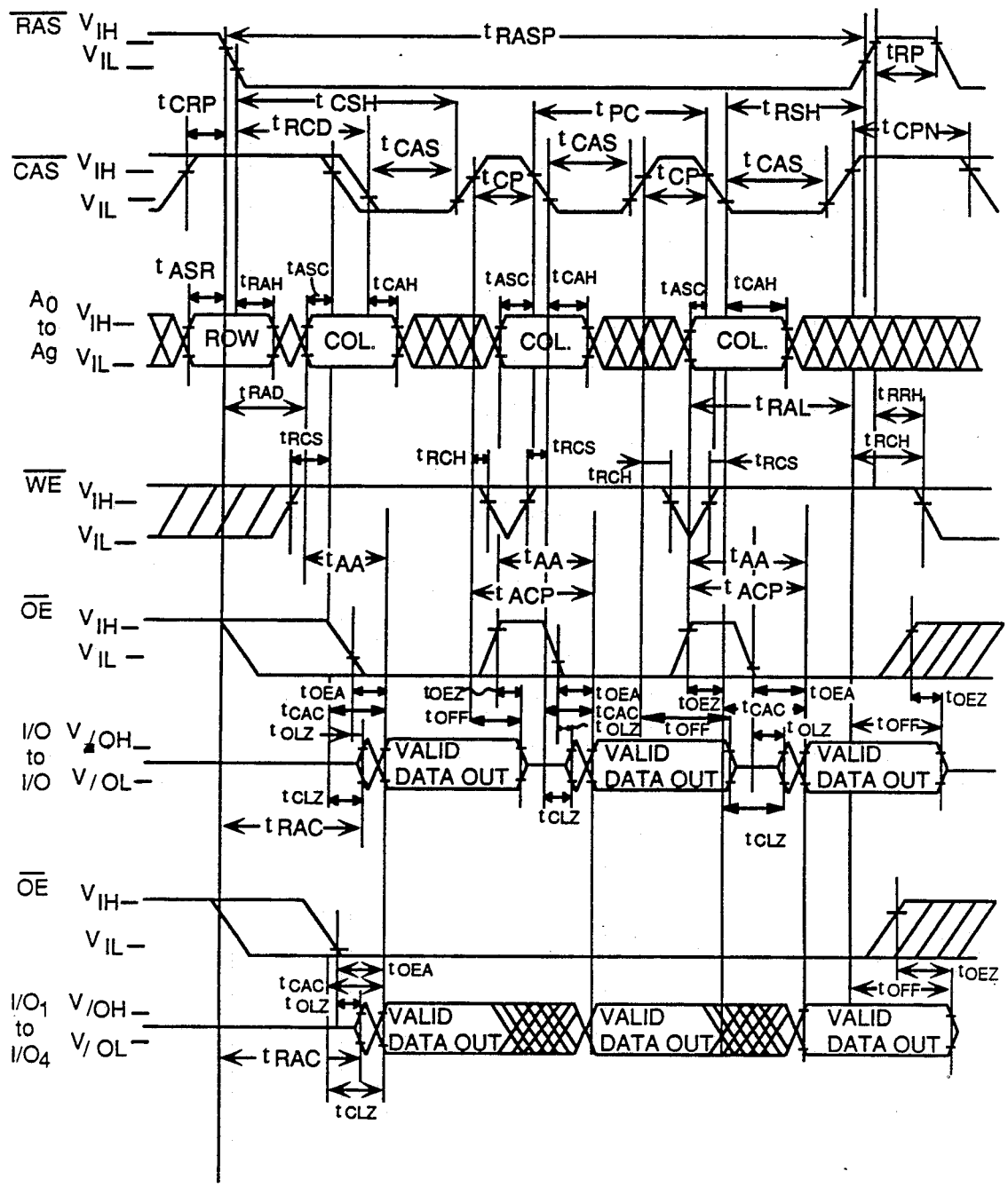
FIGS. 6a-c show various modes of operation in a dynamic random access memory system in accordance with the present invention.
Figure 6B:
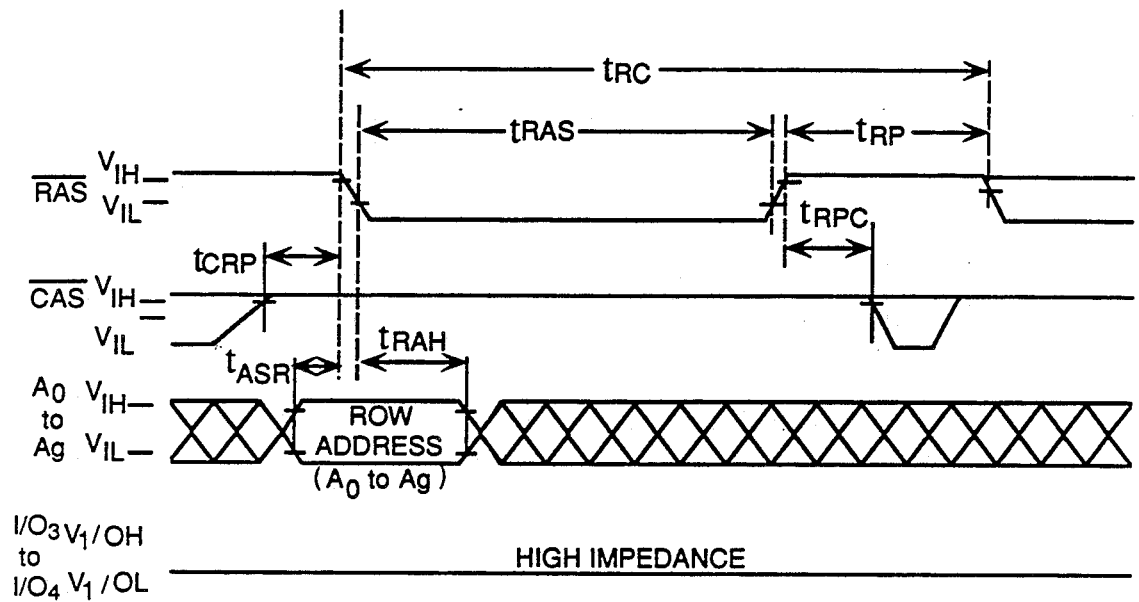
Figure 6B:
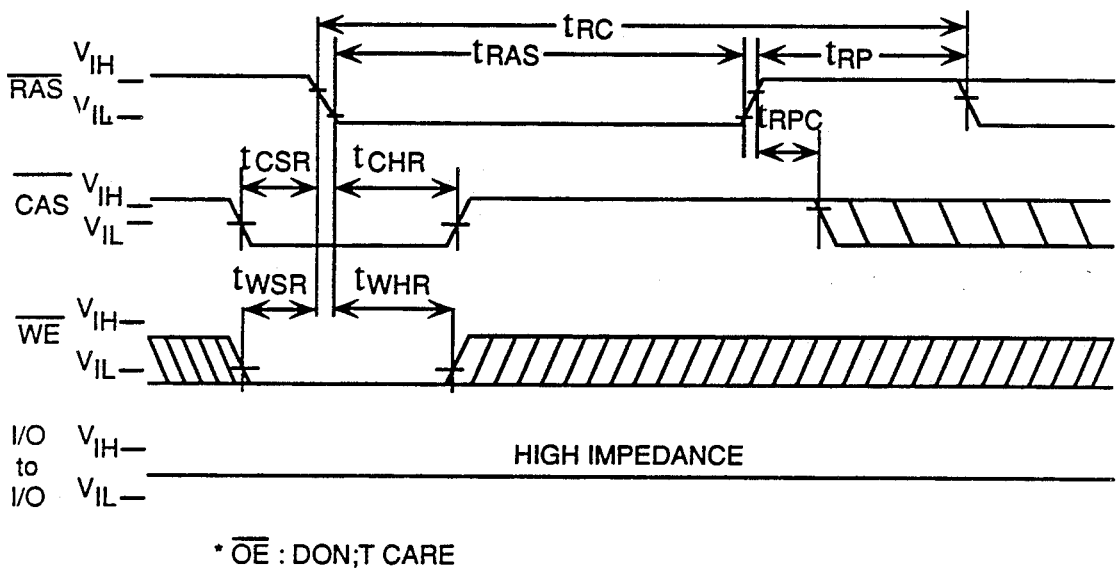
Figure 6C:
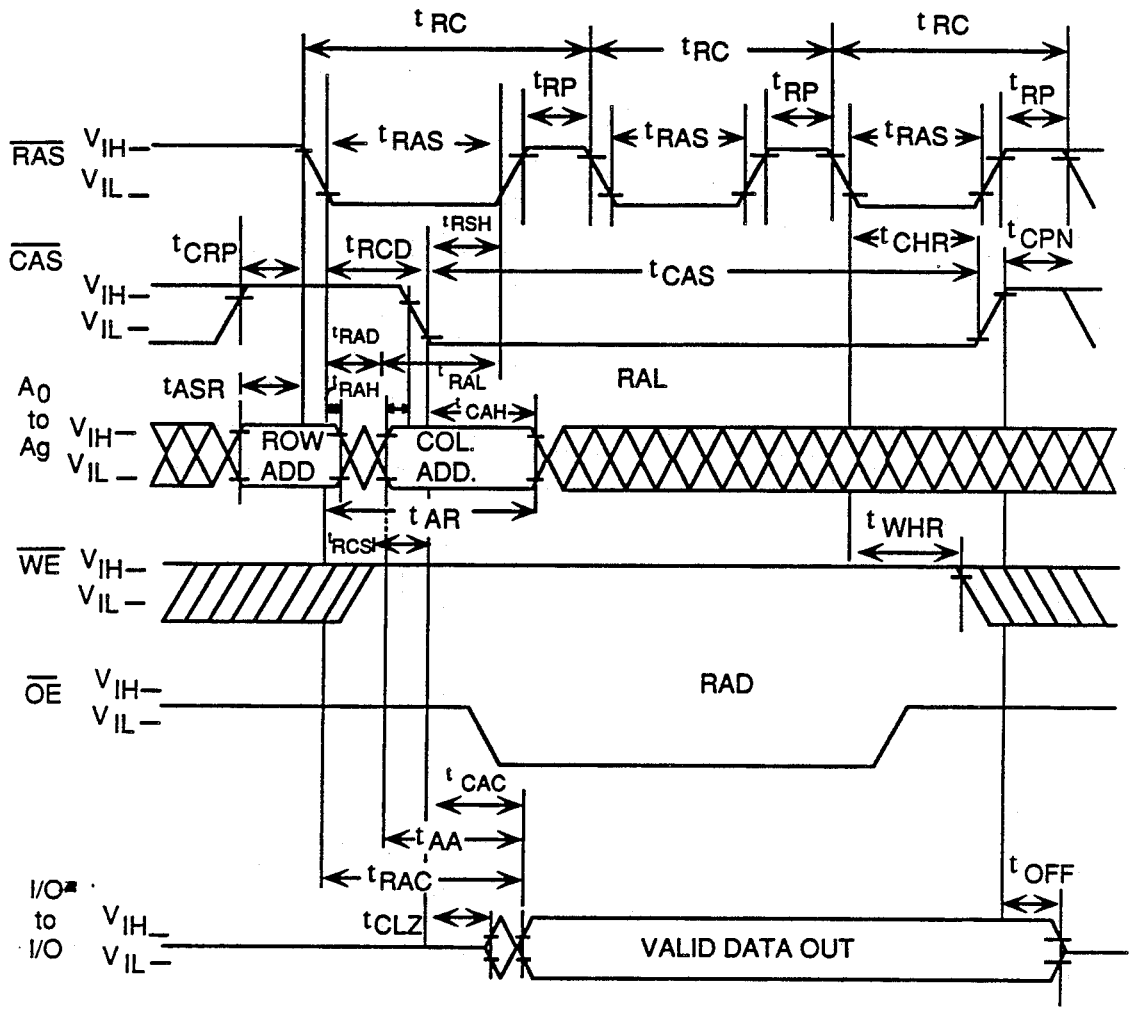

FIGS. 6a-c show several well-known operating modes of the dynamic random access memory system in FIG. 2, to be discussed in the following. The operation modes shown here are for examples only, other modes of operation are possible. The present invention relates to operations in which $\overline{RAS}$ is required to maintain active for approximately one random access, preferably the minimum period tRAS, as defined above. Hence, for example, in FIG. 6a, under the page mode, $\overline{RAS}$ is required to maintain active over several $\overline{CAS}$ active periods. The $\overline{RAS}$ active period $t_{RASP}$ is required to be much longer than one $t_{RAS}$ period, hence its operation is not improved by the present invention. On the other hand, in FIG. 6b, which corresponds to the $\overline{RAS}$ only refresh mode, the $\overline{RAS}$ active period is tRAS. Under the present invention, no skew is needed for proper operation. The system designer may rely on $t_{RAS}$ as the pulse width of the $\overline{RAS}$ active signal Similarly, in FIG. 6c, corresponding to the hidden refresh mode, the ability to operate at tRAS pulse width allows maximum efficiency under this mode also.

In general, under this invention, the system designer may operate $\overline{RAS}$ pulse width at minimum tRAS without providing for skew. In view of the above, the discussion of the random access read/write operations in conjunction with FIGS. 7a and 7b will be sufficient to illustrate that the present invention does not impose limitation on the operation modes of the dynamic random access memory system.

Figure 3:
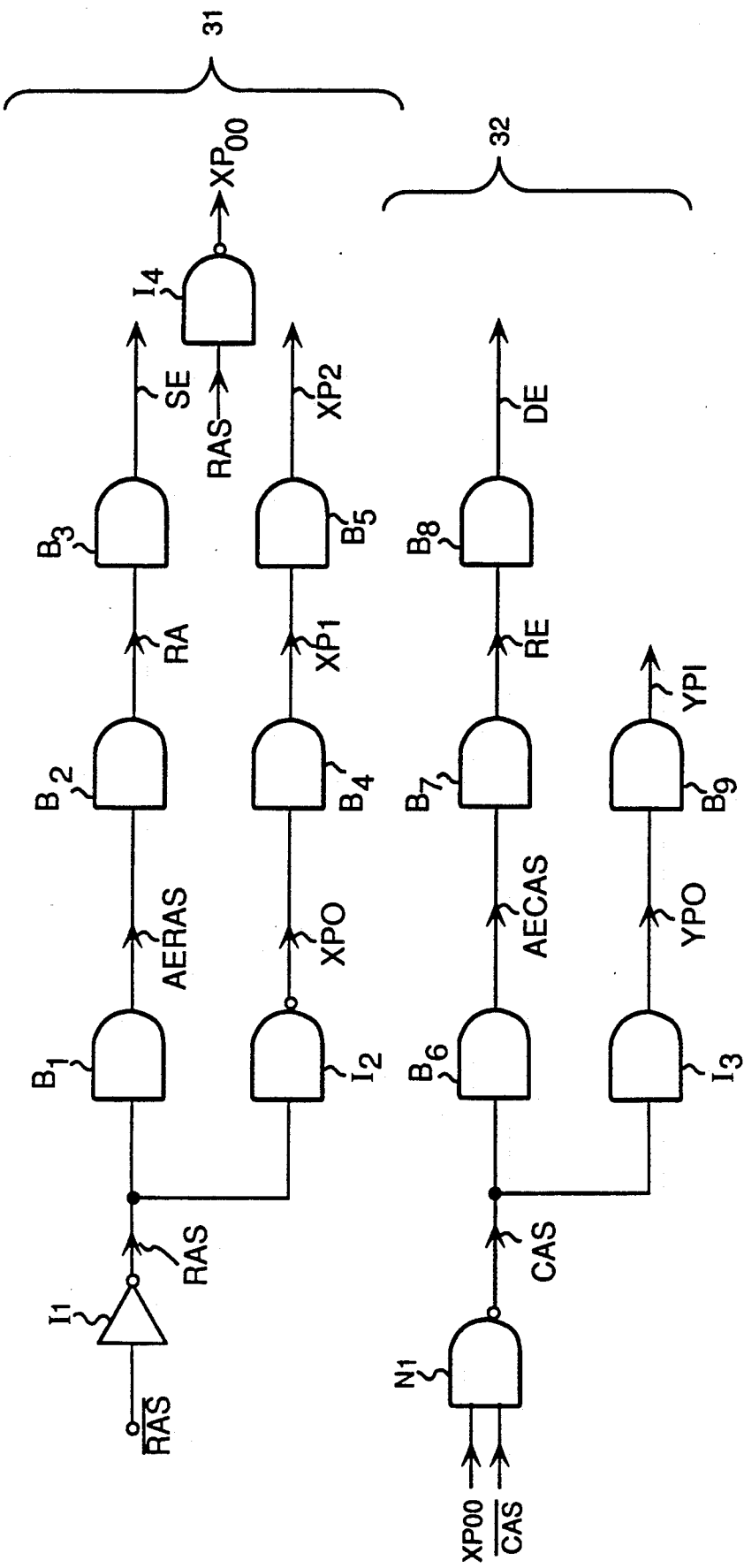
FIG. 3 shows a prior art circuit implementing $\overline{RAS}$ and $\overline{CAS}$ timing chains.
Figure 4:
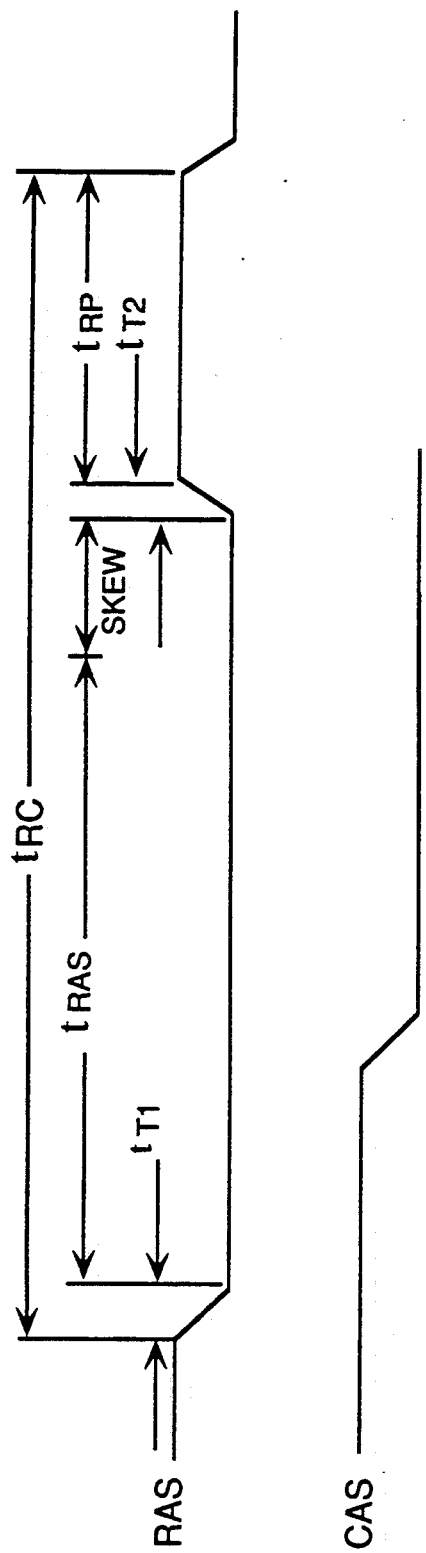
FIG. 4 shows a prior art $\overline{RAS}$ precharge timing scheme providing a skew time between data sheet tRAS and actual precharge activation time.
Figure 7A:
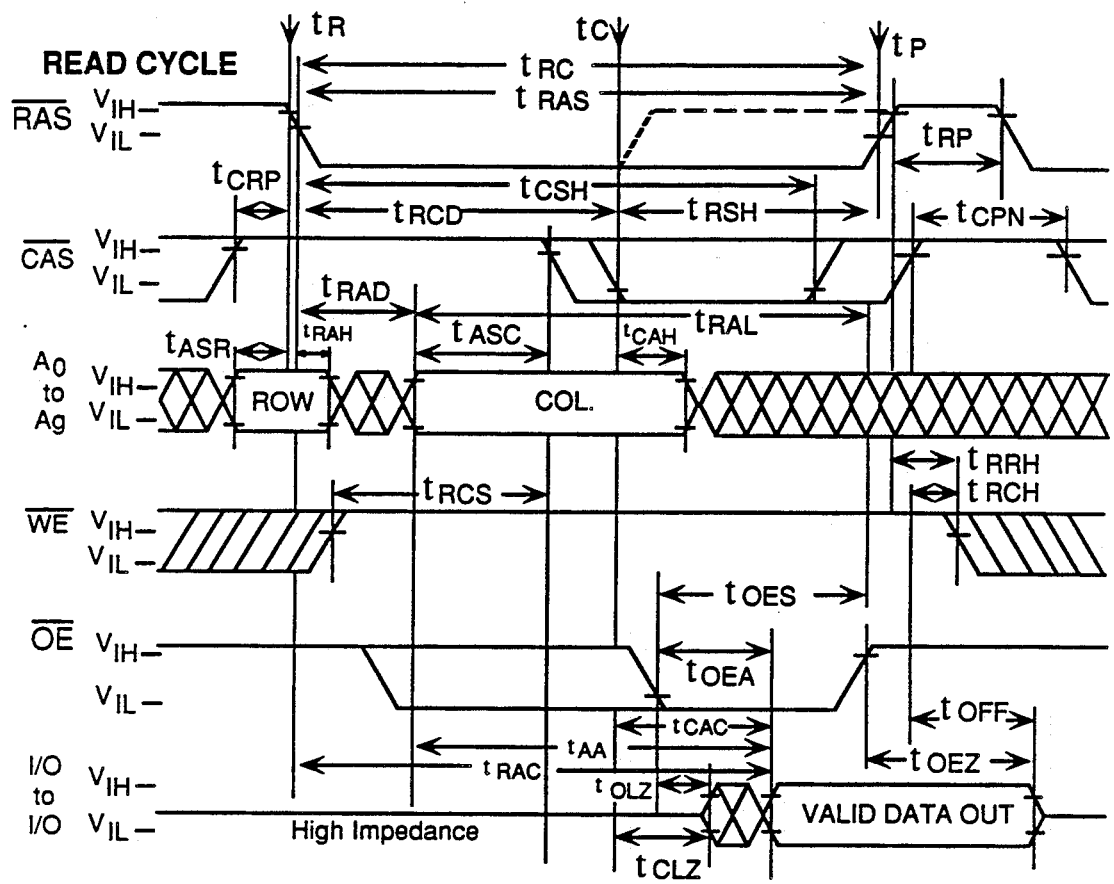
FIGS. 7a and b show the $\overline{RAS}$ precharge timing scheme in a preferred embodiment of the present invention.
Figure 7B:
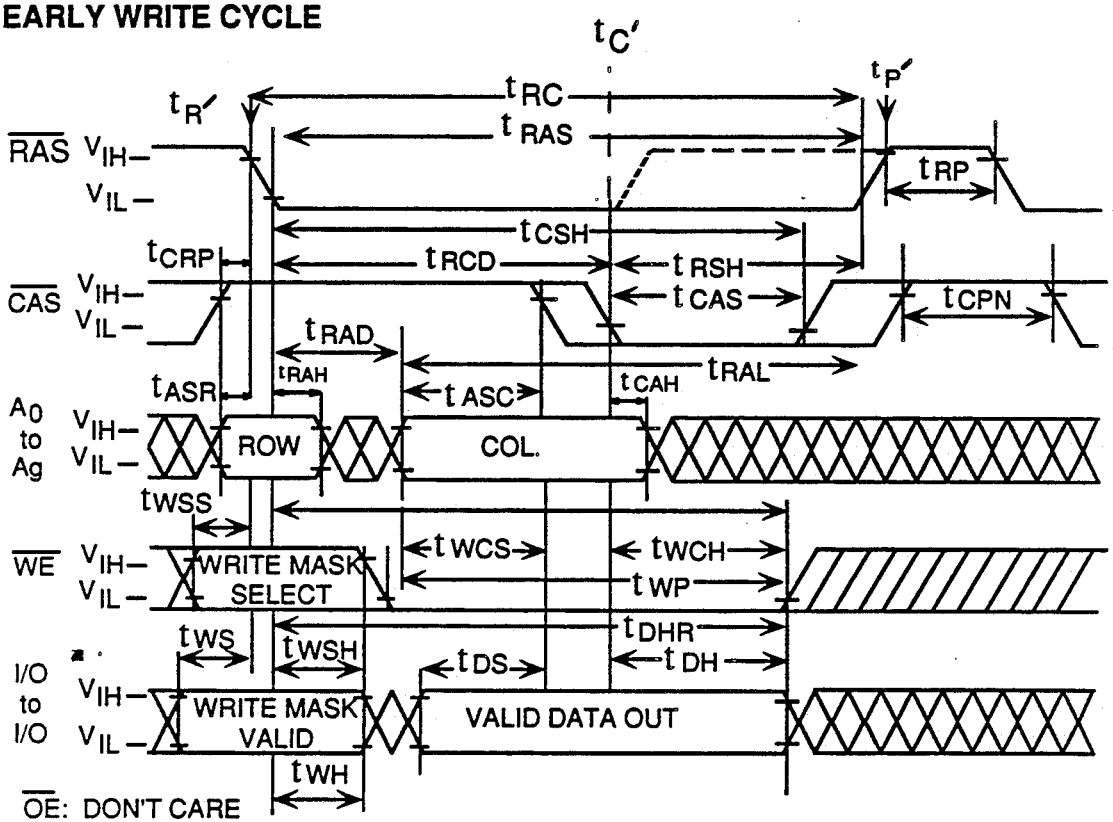

Under the random access read/write modes, the timing conditions of the external key signals $\overline{RAS}$, $\overline{CAS}$, $\overline{NE}$ and $\overline{OE}$ (output enable) are illustrated in FIGS. 7a and 7b. The arrival of the $\overline{RAS}$ active signal at $t_R$ or $t_R'$ for read or write requests respectively triggers the $\overline{RAS}$ timing chain as discussed above. Similarly, arrival of the active $\overline{CAS}$ signal at $t_C$ or $t_C'$ for read or write requests respectively triggers the $\overline{CAS}$ timing chain also discussed above. In the prior art, as for example in FIG. 3, $\overline{RAS}$ must not be brought to logic state high until sufficient time elapsed to ensure timing signals such as DE is generated. The result is that the precharge signal initiated by $\overline{RAS}$ going to logic high at $t_p$ and $t_p'$, for read and write modes respectively, is issued long after DE is generated, adding a wasteful and unnecessary skew to the total cycle time.

Figure 1:
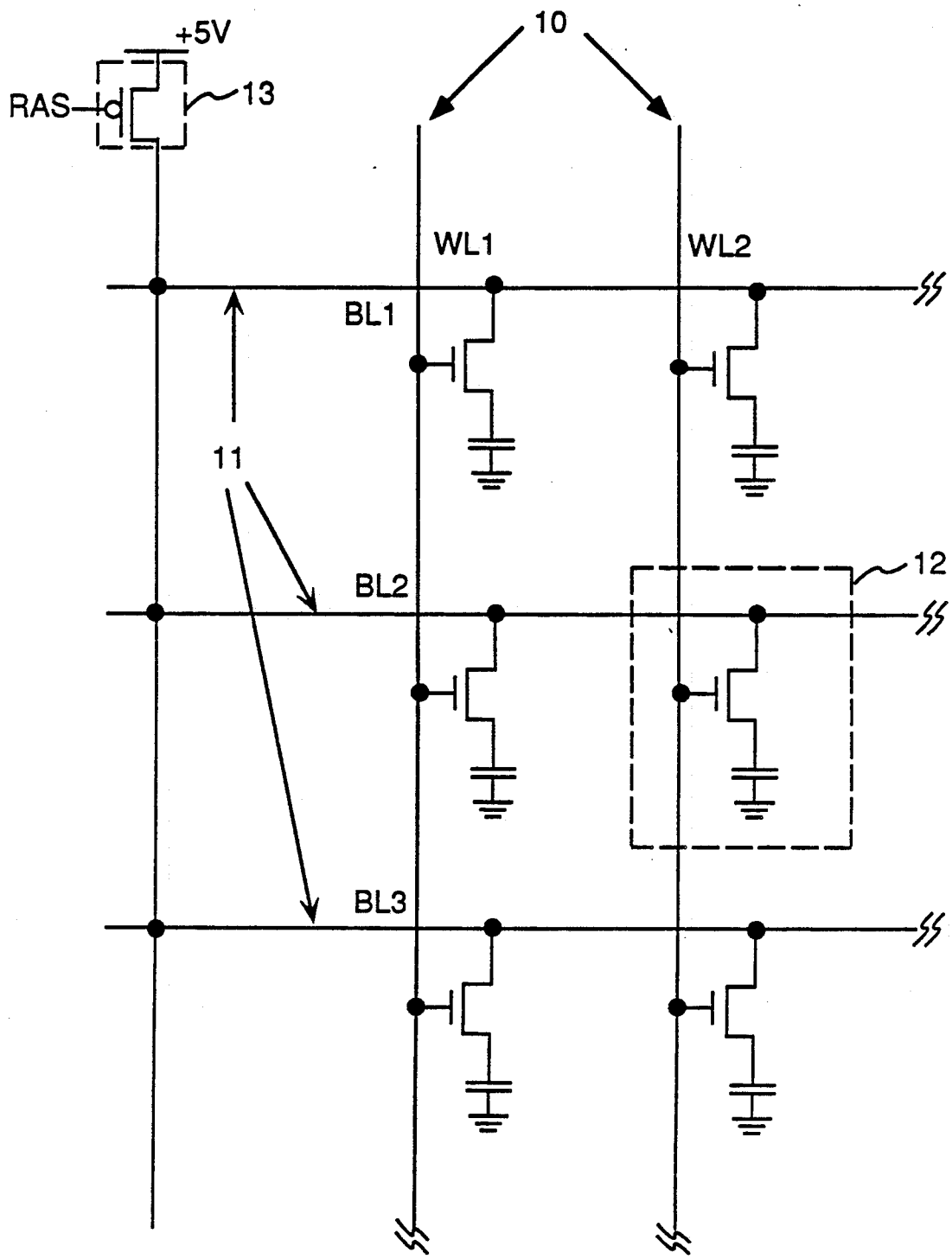
FIG. 1 shows a prior art memory circuit organization having a word line, a bit line, and a precharge mechanism.
Figure 8:
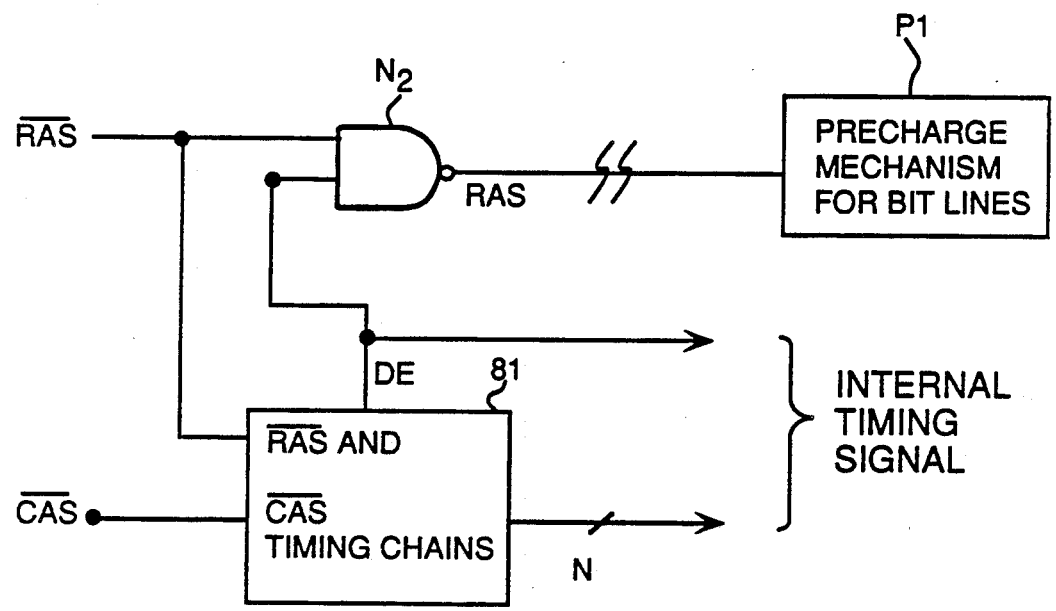
FIG. 8 shows a preferred embodiment of the present invention.

FIG. 8 shows a preferred embodiment of the present invention. FIG. 8 shows a NAND gate $N_2$ having as input signals $\overline{RAS}$ and DE, and as output signal complementary signal $\overline{RAS}$, which is used to precharge the bit lines. The precharging means P1, as shown in FIG. 8, may be implemented by precharging transistor 13, as shown in FIG. 1. The NAND gate $N_2$ is chosen because of its simple implementation in an integrated circuit, hence, it will have a minimum of delay. An AND gate can be chosen also if a high logic state is desired to initiate the precharge cycle. In fact, the precharge cycle may be initiated by any logic means which provides an output signal transition when internal timing signal $\overline{DE}$ transitions to active state, while signal $\overline{RAS}$ remains in inactive state. Internal timing signal DE is the last timing signal of the $\overline{RAS}$ and $\overline{CAS}$ timing chains 81. However, the DE signal is merely an example chosen for convenience of illustration in conjunction with the timing chain circuits discussed thus far. Any signal may be used as long as it is issued at or later than the earliest time bit line precharge may begin without affecting the reliable operation of the DRAM.

Figure 9:
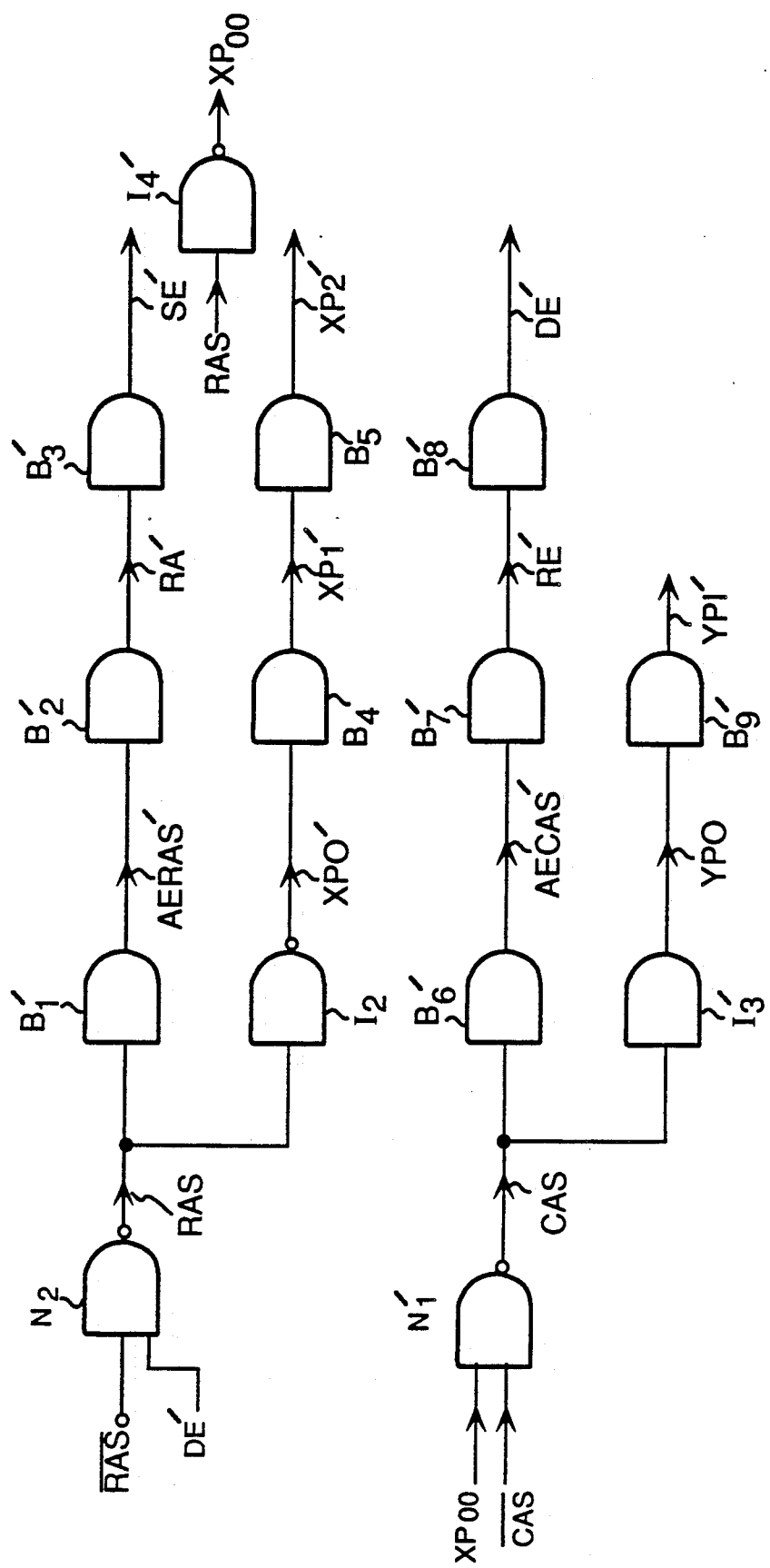
FIG. 9 shows a circuit using the preferred embodiment of the present invention.

FIG. 9 shows in block diagram form a circuit for generating the internal timing signals of the $\overline{RAS}$ timing chains, using the embodiment (nand gate $N_2$) of the present invention illustrated in FIG. 8. The circuit of FIG. 9 implements the timing sequence of the DRAM system in FIG. 2, and is functionally analogous to the circuit described in FIG. 3. According to the present invention, as illustrated in FIG. 8, the system designer may bring $\overline{RAS}$ to logic high after $\overline{CAS}$ has become active. However, nand gate $N_2$ will not allow complementary signal $\overline{RAS}$ to go to logic low, until timing signal DE' has gone to logic high; DE' is the last signal in this $\overline{CAS}$ timing chain. Precharge begins when complementary signal $\overline{RAS}$ is at logic low.

Figure 10:
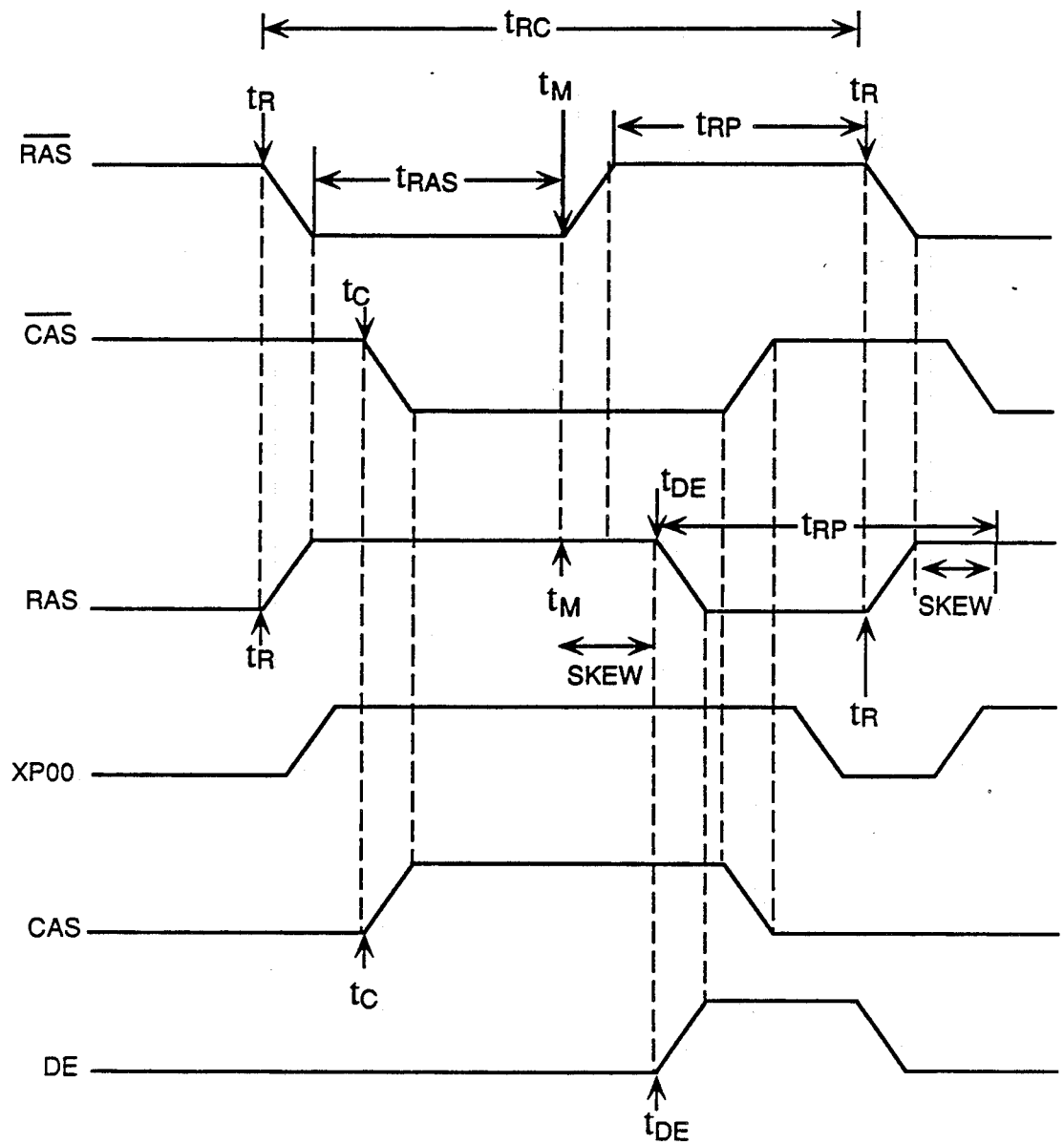
FIG. 10 shows the timing relationships among the timing signals in the circuit shown in FIG. 9.

FIG. 10 shows the timing relationships of the key internal timing signals RAS, $xP_{00}$, CAS and DE, in relation to external signals $\overline{RAS}$ and $\overline{CAS}$, in a preferred embodiment of the present invention. When $\overline{RAS}$ becomes active at $t_R$, the internal timing signal DE is at reset, the nand gate $N_2$ (FIG. 8) allows complementary timing signal $\overline{RAS}$ to go to logic high, triggering the $\overline{RAS}$ chain which produces timing signal $xP_{00}$. At the time $t_c$, $\overline{CAS}$ goes to logic low; since $xP_{00}$ is already at logic high, complementary timing signal CAS goes to logic high, driven by nand gate $N_1'$, thereby triggering off the $\overline{CAS}$ timing chain, which terminates at the timing signal DE at time $t_{DE}$. Meanwhile, the system designer using the DRAM may bring $\overline{RAS}$ back to logic high after $t_{RAS}$ period of active $\overline{RAS}$ without providing for skew. However, complementary timing signal $\overline{RAS}$ may be prevented from making a transition because timing signal DE may still be at logic low. Subsequently, at $t_{DE}$, timing signal DE is issued at $t_{DE}$, nand gate $N_2'$ then asserts complementary signal $\overline{RAS}$ to logic high, thereby beginning a precharge. Because DE is the last timing signal for which complementary timing signal $\overline{RAS}$ must remain active in order to maintain proper operation of the dynamic random access memory, there is no waste skew period between the time DE issues and the beginning of $\overline{RAS}$ precharge. Thus, it is demonstrated that by an internally gated $\overline{RAS}$ signal, the system designer may use the DRAM at the ideal random read/write system cycle.

The description of the preferred embodiment in the above is intended to be exemplary and not limiting. A person skilled in the art will no doubt conceive numerous and various modifications within the scope of the present invention. It is, therefore, intended the following claims define the scope and limitations of the present invention.

What is claimed is:

1. A method for minimizing cycle time in a memory cycle of a dynamic random access memory (DRAM) system having a bit line precharging means activated upon receipt of a precharge signal, said method comprising the steps of:
   providing an $\overline{RAS}$ signal having a first $\overline{RAS}$ signal logic state and a second $\overline{RAS}$ signal logic state, whereupon transition to said first $\overline{RAS}$ signal logic state initiates said memory cycle;
   providing an internal timing signal having a first timing signal logic state and a second timing signal logic state, said internal timing signal transitioning from said first timing signal logic state to said second timing signal logic state at a time after said memory cycle has been initiated; and
   generating said precharge signal to activate said bit line precharging means upon said $\overline{RAS}$ signal transitioning to said second $\overline{RAS}$ signal logic state and said internal timing signal transitioning to said second timing signal logic state.

2. A method as in claim 1 for minimizing cycle time in a memory cycle of a DRAM system wherein said internal timing signal is generated at or later than the earliest time said bit line precharge means may begin precharge without affecting reliable operation of said DRAM.

3. A method as in claim 1 for minimizing cycle time in a memory cycle of a DRAM system wherein, said internal timing signal is the last of a plurality of internal timing signals generated in response to a $\overline{CAS}$ signal.

4. A method as in claim 1 for minimizing cycle time in a memory cycle of a DRAM system wherein the step of generating said precharge signal to activate said bit line precharging means is accomplished by logic means having said $\overline{RAS}$ signal and said internal timing signal as input signals and said precharge signal as an output signal.

5. A method as in claim 4 for minimizing cycle time in a memory cycle of a DRAM, wherein said logic means is a NAND gate.

6. A dynamic random access memory (DRAM) of the type having a plurality of bit lines and a bit line precharge means for precharging said plurality of bit lines upon receipt of a precharge signal, said DRAM further comprising:
   an $\overline{RAS}$ signal input terminal for receiving an $\overline{RAS}$ signal having a first $\overline{RAS}$ signal logic state and a second $\overline{RAS}$ signal logic state, said first $\overline{RAS}$ signal logic state being for initiating a memory cycle in said DRAM, said second $\overline{RAS}$ signal logic state being generated at a time after said memory cycle has been initiated;
   an internal timing signal generation means for generating a timing signal having a first timing signal logic state and a second timing signal logic state, said internal timing signal transitioning from said first timing signal logic state to said second timing signal logic state at a time after said memory cycle has been initiated; and logic means coupled to receive said $\overline{RAS}$ signal and said internal timing signal for detecting a condition where said $\overline{RAS}$ signal has transitioned to said second $\overline{RAS}$ signal logic state and said internal timing signal has transitioned to said second timing signal logic state and, in response to such detection, generating said precharge signal for application to said bit line precharging means.

7. A DRAM as in claim 6, wherein said internal timing signal is generated at or later than the earliest time said bit line precharge means may begin precharge without affecting reliable operation of said DRAM.

8. A DRAM as in claim 6, wherein said internal timing signal is the last of a plurality of internal timing signals generated in response to a $\overline{CAS}$ signal.

9. A DRAM as in claim 6, wherein said logic means is a NAND gate.

* * * * *